United States Patent [19]

Sato et al.

[11] Patent Number: 4,654,294
[45] Date of Patent: Mar. 31, 1987

[54] PHOTOSENSITIVE ETHYLENICALLY UNSATURATED COMPOSITION CONTAINING A VINYL ALCOHOL POLYMER HAVING A THIOL GROUP

[75] Inventors: Toshiaki Sato; Junnosuke Yamauchi, both of Kurashiki; Takuji Okaya, Nagaokakyo, all of Japan

[73] Assignee: Kuraray Co., Ltd., Kurashiki, Japan

[21] Appl. No.: 840,771

[22] Filed: Mar. 18, 1986

[30] Foreign Application Priority Data

Mar. 22, 1985 [JP] Japan .................................. 60-59141

[51] Int. Cl.$^4$ .............................................. G03C 1/68
[52] U.S. Cl. .................................... 430/281; 430/905; 430/909; 522/116; 522/117; 522/120; 522/153; 525/59; 526/286
[58] Field of Search ...................... 430/281, 905, 909; 522/116, 117, 120, 121, 156; 525/59; 526/286

[56] References Cited

U.S. PATENT DOCUMENTS

| | | | |
|---|---|---|---|
| 3,732,105 | 5/1973 | Klupfel et al. | 430/909 |
| 3,801,327 | 4/1974 | Moreau | 430/909 |
| 4,233,395 | 11/1980 | Klupfel et al. | 430/281 |

*Primary Examiner*—Jack P. Brammer
*Attorney, Agent, or Firm*—Oblon, Fisher, Spivak, McClelland & Maier

[57] ABSTRACT

A photosensitive composition which comprises:
(a) a vinyl alcohol polymer having at least one thiol group in the molecule thereof,
(b) an ethylenically unsaturated compound which is radically polymerizable, and,
(c) a photoinitiator, and is free from the defect of the removal of the vinyl alcohol polymer at the hardened regions upon development with water.

8 Claims, No Drawings

PHOTOSENSITIVE ETHYLENICALLY UNSATURATED COMPOSITION CONTAINING A VINYL ALCOHOL POLYMER HAVING A THIOL GROUP

BACKGROUND OF THE INVENTION

1. Field of the Invention

The present invention relates to a photosensitive composition.

A composition comprising a vinyl alcohol polymer, an ethylenically unsaturated compound which is radically polymerizable (hereafter referred to as "polymerizable monomer") and a photoinitiator is called a photosensitive composition and has been widely utilized, for example, as plate-making material for letterpress plate.

2. Description of the Prior Art

The above-mentioned photosensitive composition is exposed and developed, after it is prepared in a sheet form (referred to as "photosensitive resin plate") by providing it on a support such as a metal plate or a film plate, to form a resin relief. A photosensitive composition containing a vinyl alcohol polymer has been highly evaluated and widely used in the art of printing because its unhardened regions can easily be washed out with water after exposure and processing operations are easy (Published Examined Japanese Patent Application Nos. 39401/71 and 3041/75).

However, photosensitive compositions containing conventional vinyl alcohol polymers involve a serious drawback that even the vinyl alcohol polymers at hardened regions are removed upon removal of unhardened regions after exposure by washing with water, namely, upon development; for this reason, it is an actual situation that properties of resin relieves obtained are markedly injured.

SUMMARY OF THE INVENTION

The present invention provides a photosensitive composition which eliminates the drawback possessed by photosensitive compositions containing conventional vinyl alcohol polymers as described above. Namely, vinyl alcohol polymers at the hardened regions are not removed in the photosensitive composition in the present invention.

DETAILED DESCRIPTION OF THE PREFERRED EMBODIMENTS

As a result of extensive investigations on photosensitive compositions free from the defect of the removal of vinyl alcohol polymers at the hardened regions upon development with water while keeping excellent properties inherently possessed by vinyl alcohol polymer photosensitive compositions, the present inventors have found that the foregoing object can be achieved by the use of a vinyl alcohol polymer having at least one thiol group in the molecule thereof, preferably at the ends thereof, most preferably at one end thereof, and have thus accomplished the present invention.

Namely, the present invention relates to a photosensitive composition comprising (a) a vinyl alcohol polymer having at least one thiol group in the molecule thereof, (b) an ethylenically unsaturated compound which is radically polymerizable and (c) a photoinitiator, as photosensitive components.

As the vinyl alcohol polymer having at least one thiol group in the molecule thereof which can be used in the present invention, any vinyl alcohol polymer can be employed as far as it contains at least one thiol group in the molecule thereof; however, it is preferred that the content of the thiol group in the vinyl alcohol polymer is 0.01 to 5 mol%, preferably not greater than 2 mol%, more preferably not greater than 1 mol%, since the thiol group is very easily oxidized. Further for the same reason, the vinyl alcohol polymer having at least one thiol group at the ends thereof, especially preferably only at one end thereof is particularly preferably employed for the purpose of achieving the object of the present invention.

It is preferred that the degree of polymerization is from 20 to 5000, preferably from 50 to 2000, more preferably from 100 to 2000, all inclusive. The degree of hydrolysis is not particularly limited as far as the vinyl alcohol polymer is soluble or dispersible in water, but preferably from 30 to 100 mol%, more preferably from 50 to 90 mol%.

Of the vinyl alcohol polymers having at least one thiol group in the molecule thereof described above, particularly preferred are vinyl alcohol polymers having a thiol group only at one end of the molecule thereof which are represented by general formula;

P-SH wherein P contains the following units A and B, wherein the content of A is 100 to 30 mol%, preferably 90 to 50 mol%, and wherein the degree of polymerization is from 20 to 5000, preferably 100 to 2000.

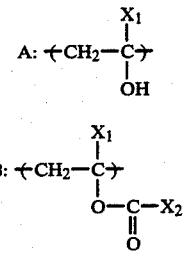

wherein $X_1$ represents H or a hydrocarbon group having 1 to 6 carbon atoms and $X_2$ represents H or a hydrocarbon group having 1 to 20 carbon atoms.

Further the vinyl alcohol polymer may contain various monomer units in such a range that does not injure the effects of the present invention. Examples of these monomer units include ethylene, propylene, 1-butene, isobutylene, vinyl formate, isopropenyl acetate, vinyl propionate, vinyl versatate, (meth)acrylic acid and salts thereof or lower alkyl ethers thereof (methyl ester, ethyl ester, butyl ester); itaconic acid, maleic acid, fumaric acid and salts thereof, (meth)acrylamide, N,N-dimethylacrylamide, acrylamide-2-methylpropanesulfonic acid and salts thereof, (meth)allylsulfonic acid and salts thereof, (meth)acrylamidepropyltrimethyl ammonium chloride, N-vinylpyrolidone, allyl alcohol, allyl acetate, 2-methyl-3-buten-2-ol, etc.

Even in case that these monomer units are contained, there is no particular limitation to the degree of hydrolysis but it is sufficient that the polymer is dispersible or soluble in water.

As the polymerizable monomer used in the present invention, any monomer is usable as far as it can undergo radical polymerization by a photoinitiator; however, those having good compatibility with the vinyl alcohol polymer or the photoinitiator are preferably employed. Examples of such monomers are at least one of the groups of the following general formulae [I], [II], [III] and [IV].

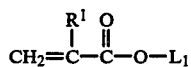   [I]

wherein
R$^1$ represents H or CH$_3$,
L$_1$ represents;

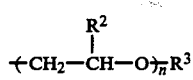

(wherein n=1~100), $+CH_1-CH_2CH_2$ $CH_2-O+_mR^3$ (wherein m=1~100) $-C_pH_{2p+1}$ (wherein p=1~6),

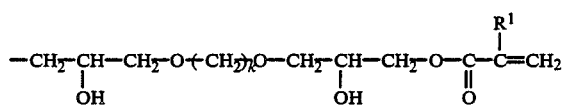

(wherein K=2~10) or,

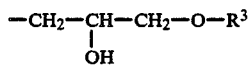

wherein R$^2$ represents H or CH$_3$, and R$^3$ represents H, CH$_3$, C$_2$H$_5$, C$_4$H$_9$,

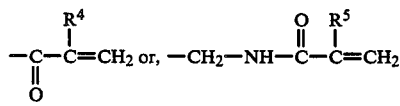

wherein R$^4$ or R$^5$ represents H or CH$_3$.

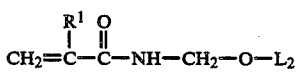   [II]

wherein
R$^1$ represents H or CH$_3$,
L$_2$ represents;

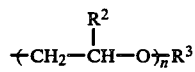

(wherein n=1~100), $+CH_2-CH_2CH_2C$-H$_2$—O$+_mR^3$ (wherein m=1~100) —C$_p$H$_{2p+1}$ (wherein p=1~6), or H,
wherein R$^2$ represents H or CH$_3$, and R$^3$ represents H, CH$_3$, C$_2$H$_5$, C$_4$H$_9$ or,

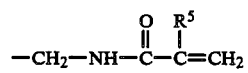

wherein R$^5$ represents H or CH$_3$.

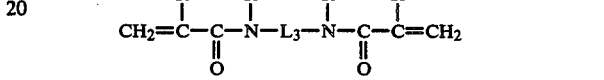   [III]

wherein
R$^1$ represents H or CH$_3$,
R$^6$ represents H, CH$_3$ or C$_2$H$_5$,
L$_3$ represents —CH$_2$—$_q$ (wherein q=1~6),

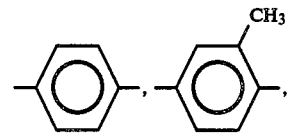

or,
—CH$_2$—CH$_2$—NH—$_r$CH$_2$CH$_2$—  (wherein r =1~10).

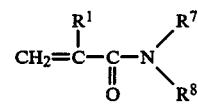   [IV]

wherein
R$^1$ represents H or CH$_3$,
R$^7$ represents H, CH$_3$, C$_2$H$_5$ or CH$_2$CH$_2$OH,
R$^8$ represents H, CH$_3$, C$_2$H$_5$ or CH$_2$CH$_2$ OH.

Specific examples of compounds represented by general formula [I] described above are shown below.

 (1)

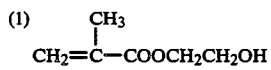 (2)

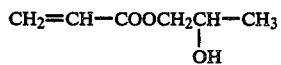 (3)

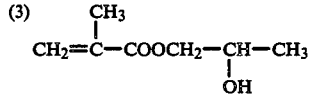 (4)

 (5)

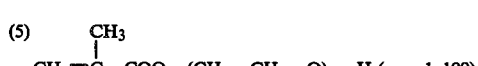 (6)

 (7)

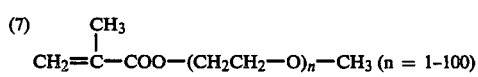 (8)

 (9)  (10)

 (11)

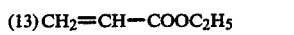 (12)

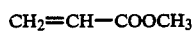 (13)  (14)

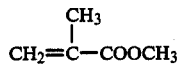 (15) CH$_2$=CH—COOH (16)

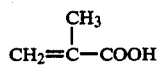 (17) 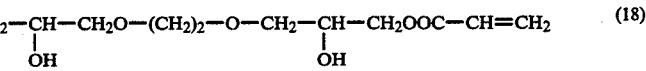 (18)

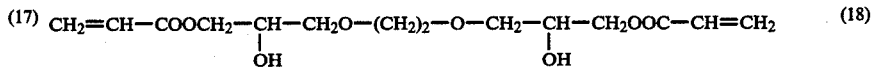 (19)

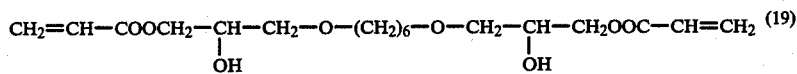 (20)

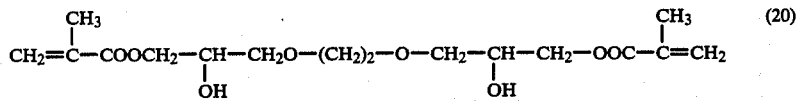 (21)

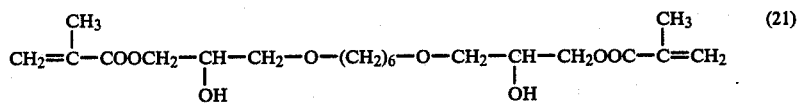 (22)

CH$_2$=CH—COO—(CH$_2$CH$_2$—O)$_n$—COCH=CH$_2$ (n = 1-100)

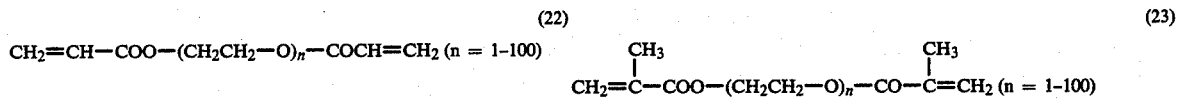 (23)

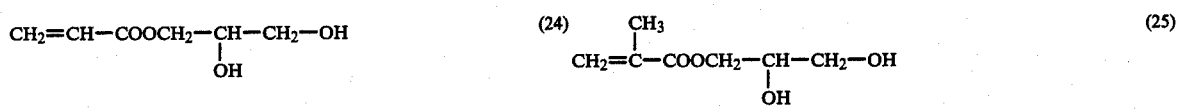 (24) (25)

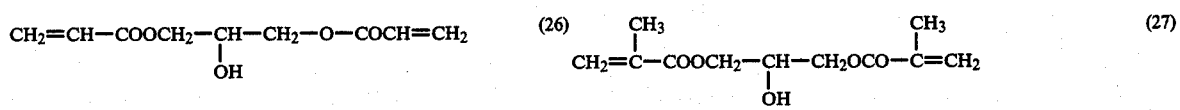 (26) (27)

Of these, 2, 4, 5, 6, 7, 8, 9, 10, 11, 12, 18, 20, 22, 23, 24 and 25 are more preferred (wherein n=1-20).

Specific examples of compounds represented by general formula [II] described above are shown below.

 (28)

 (29)

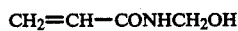 (30)

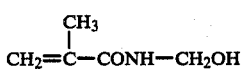 (31)

 (32)

 (33)

CH$_2$=CHCONHCH$_2$OC$_4$H$_9$ (34)

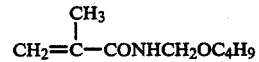 (35)

CH$_2$=CHCONHCH$_2$O—(CH$_2$CH$_2$—O)$_n$—H (n = 1-100) (36)

 (37)

CH$_2$=CHCONHCH$_2$O—(CH$_2$CH$_2$—O)$_n$—CH$_2$NHCOCH=CH$_2$ (38)
(n = 1-100)

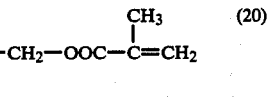 (39)
(n = 1-100)

Of these, 28, 29, 30, 32, 33, 34, 35, 38 and 39 are more preferred (wherein n=1-20).

Specific examples of compounds represented by general formula [III] described above are shown below.

CH$_2$=CHCONH—CH$_2$NHCOCH=CH$_2$ (40)

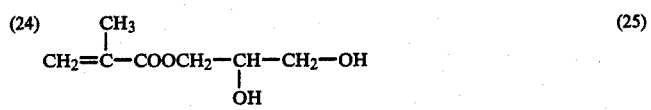 (41)

CH$_2$=CHCONHCH$_2$CH$_2$NHCOCH=CH$_2$ (42)

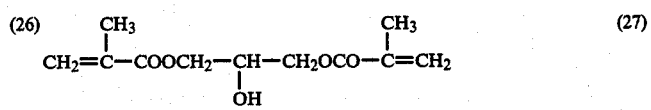 (43)

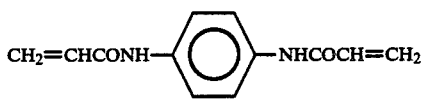
(44)

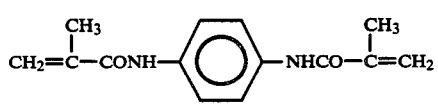
(45)

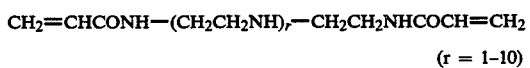
(46)

(r = 1-10)

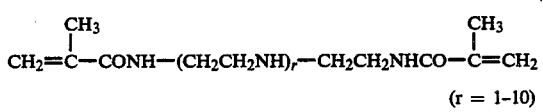
(47)

(r = 1-10)

Of these, 40, 42, 44 and 46 are more preferred (wherein r=1-5).

Specific examples of compounds represented by general formula [IV] described above are shown below.

(48)

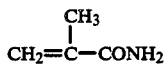
(49)

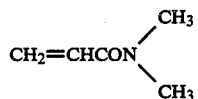
(50)

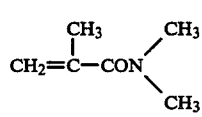
(51)

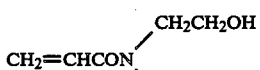
(52)

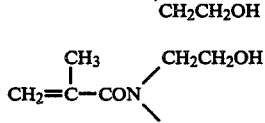
(53)

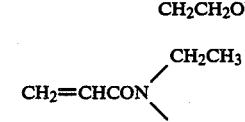
(54)

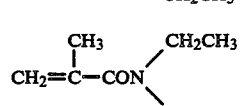
(55)

Of these, 50, 51, 52 and 53 are more preferred.

In addition to those represented by general formula [I], [II], [III] or [IV] described above, there may also be used monomers, especially polyfunctional monomers such as trimethylolpropane dimethacrylate, trimethylolpropane trimethacrylate, triacryl formal, triallyl cyanurate, triallyl isocyanurate, etc., singly or in combination.

These monomers are used singly or as a mixture thereof.

Examples of the photoinitiators which can be used in the present invention include benzophenone, benzoin, p,p'-dimethylbenzoin, benzoyl methyl ether, benzoin isopropyl ether; acyloin, a substituted aromatic acylion or acylion alkyl ether; diacetyl, benzyl, ketoaldonyl compounds, 1,1'-azocyclohexanecarbonitrile, azonitrile, 9,10-anthraquinone, chloro anthraquinone, 1,4-naphthoquinone, 9,10-phenanthrequinone, etc.

The photosensitive composition of the present invention comprising (a) the vinyl alcohol polymer having at least one thiol group in the molecule thereof, (b) the ethylenically unsaturated compound which is radically polymerizable and (c) the photoinitiator as photosensitive components can be preferably used in a range of, per 100 parts by weight of (a), 30 to 250 parts by weight of (b) and 0.01 to 15 parts by weight of (c), respectively; however, components other than (a), (b) and (c), for example, conventional vinyl alcohol polymers, amide polymers or the like may also be used within such a range that does not injure the feature of the present invention.

The photosensitive composition of the present invention may further contain known agents which prevent thermal polymerization, or stabilizers for purpose of improving stability during storage and, if necessary and desired, may further contain other additives such as colorants, pigments, plasticizers, etc.

Further there is no particular restriction to a method of forming photosensitive resin plates upon using the compositions of the present invention as letterpress plates, and a method of casting from an aqueous solution, etc. can be adopted.

The photosensitive composition of the present invention comprising the vinyl alcohol polymer having at least one thiol group in the molecule thereof provides almost no removal of the vinyl alcohol polymer at the hardened regions upon development by washing with water and is extremely excellent, as compared to the photosensitive composition containing conventional vinyl alcohol polymers.

In the photosensitive composition comprising a vinyl alcohol polymer, a polymerizable monomer and a photoinitiator, the monomer is polymerized to render it insoluble in water, upon exposure to light; however, in the case of using conventional vinyl alcohol polymers, it is assumed that a grafting reaction to the vinyl alcohol polymers would hardly occur upon polymerization of the monomer and therefore, the vinyl alcohol polymers would be relatively easily extracted by washing with water, even after hardening.

On the other hand, it is assumed that in the present invention, grafted or block polymers would be produced upon photopolymerization by introducing at least one thiol group having an extremely large reactivity to radicals into a vinyl alcohol polymer so that the solubility of the vinyl alcohol polymer after exposure in water would be reduced and due to the formation of the grafted or block polymer, phase separation accompanied by polymerization of the monomer would be prevented and as a result, the effect described above would be obtained.

Hereafter, the photosensitive composition of the present invention will be described with reference to the examples below but the present invention is not deemed to be limited thereto. "Part" and "%" are "part by weight" and "% by weight", unless otherwise indicated.

(a) Synthesis of vinyl alcohol polymer having a thiol group at one end thereof:

In a reactor were charged 2400 parts of vinyl acetate (hereafter simply referred to as VAc), 560 parts of methanol and 0.45 parts of thiolacetic acid. After the interior was thoroughly substituted with nitrogen, the reaction temperature was elevated to 65° C. When the inner temperature reached 60° C., 40 parts of methanol containing 1.74 parts of 2,2'-azobisisobutylonitrile were added to the system. Immediately thereafter, 60 parts of a methanol solution containing 8.53 parts of thiolacetic acid were uniformly added over 4 hours.

Conversion to polymer after 4 hours was 73.1%. After cooling, unreacted VAc was distilled away together with methanol under reduced pressure by adding methanol to the reactor continuously.

Hydrolysis was performed in a PVAc concentration of 50% and [NaOH]/[VAc]=0.010 at 40° C. to yield a vinyl alcohol polymer having a thiol group at one end thereof, showing a degree of polymerization of 310, a degree of hydrolysis of 88 mol% and a thiol group content of 0.25 mol%. The thiol group content was a value determined by the iodine titration method.

(b) Synthesis of vinyl alcohol polymer having a thiol group in the side chain thereof:

In a reactor were charged 2368 parts of vinyl acetate (hereafter simply referred to as VAc), 560 parts of methanol and 32 parts of allyl thiolacetate. After the interior was thoroughly substituted with nitrogen, the reaction temperature was elevated to 65° C. When the inner temperature reached 60° C., 40 parts of methanol containing 3.5 parts of 2,2'-azobisisobutylonitrile were added to the system. Polymerization was performed for 7 hours.

Conversion to polymer was 67.2%. After cooling, unreacted VAc was distilled away together with methanol under reduced pressure by adding methanol to the reactor continuously.

Hydrolysis was performed in a PVAc concentration of 50% and [NaOH]/[VAc]=0.012 at 40° C. to yield a vinyl alcohol polymer having an allylthiol group in the side chain thereof, showing a degree of polymerization of 290, a degree of hydrolysis of 88 mol% and a thiol group content of 0.80 mol%. The thiol group conent was a value determined by the iodine titration method.

EXAMPLE 1

| | |
|---|---|
| Vinyl alcohol polymer having a thiol group at one end thereof (degree of polymerization of 210, degree of hydrolysis of 80 mol %, thiol group content of 0.45 mol %) | 100 parts |
| 2-Hydroxypropyl methacrylate | 80 parts |
| Tetraethyleneglycol dimethacrylate | 20 parts |
| Methylhydroquinone | 0.05 parts |
| Benzoin isopropyl ether | 3 parts |
| Water (pH = 3.0) | 200 parts |

Each of the components described above was homogeneously dissolved in a flask with heating at 90° C. while stirring. After the resulting solution was defoamed, it was coated onto an aluminum plate and dried at 80° C. for 30 minutes to obtain two photosensitive sheets each having a thickness of 0.5 mm.

One photosensitive sheet was exposed to a high voltage mercury lamp of 2 kw for 10 minutes from a distance of 75 cm to obtain a hardened sheet (which was designated Hardened Sheet 1).

Another photosensitive sheet was allowed to stand for 2 to 3 hours in a carbon dioxide flow and then exposed to light for 3 minutes by bringing it into close contact with a dot negative in a vacuum. As a light source, a carbon arc lamp of an illuminance of 2000 lux was used. After exposure, development was performed using water followed by drying at 100° C. for 2 minutes in a drier. After drying, exposure was again performed for 2 minutes using a carbon arc lamp, whereby unexposed regions were hardened (which was designated Hardened Sheet 2).

[Hardened Sheet 1] was immersed in a hot water of 90° C. for 2 hours and the weight of the vinyl alcohol polymer extracted in hot water was examined. The results with [Hardened Sheet 1] and the photosensitivity of [Hardened Sheet 2] are shown in Table 1 together.

EXAMPLE 2

| | |
|---|---|
| Vinyl alcohol polymer having a thiol group at one end thereof (degree of polymerization of 310, degree of hydrolysis of 88 mol %, thiol group content of 0.25 mol %) | 100 parts |
| 2-Hydroxyethyl methacrylate | 90 parts |
| Ethyleneglycol dimethacrylate | 10 parts |
| Methylhydroquinone | 0.05 parts |
| Benzoin isopropyl ether | 3 parts |
| Water (pH = 3.0) | 200 parts |

Using the respective components described above, photosensitive sheets were obtained and examined in a manner similar to Example 1. The test results are shown in Table 1.

EXAMPLE 3

A hardened sheet was obtained and examined in a manner similar to Example 2 except that a vinyl alcohol polymer having a thiol group at one end thereof (degree of polymerization of 550, degree of hydrolysis of 80 mol%, thiol group content of 0.15 mol%) was used as the vinyl alcohol polymer. The test results are shown in Table 1.

EXAMPLE 4

A hardened sheet was obtained and examined in a manner similar to Example 2 except that a vinyl alcohol polymer having an allylthiol group in the side chain thereof (degree of polymerization of 290, degree of hydrolysis of 88 mol%, thiol group content of 0.08 mol%) was used as the vinyl alcohol polymer. The test results are shown in Table 1.

EXAMPLE 5

| | |
|---|---|
| Vinyl alcohol polymer having a thiol group at one end thereof (copolymerized with 10 mol % of allyl acetate, degree of hydrolysis of 72 mol %, thiol group content of 0.3 mol %) | 100 parts |
| N—Methoxymethyl acrylate | 40 parts |
| Ethylenebisacrylamide | 10 parts |
| Methylhydroquinone | 0.05 parts |
| Benzoin isopropyl ether | 3 parts |
| Water (pH = 3.0) | 150 parts |

Using the respective components described above, photosensitive sheets were obtained and examined in a manner similar to Example 1. The test results are shown in Table 1.

EXAMPLE 6

| | |
|---|---|
| Vinyl alcohol polymer having a thiol group at one end thereof (degree of polymerization of 52, degree of hydrolysis of 88 mol %, thiol group content of 1.9 mol %) | 30 parts |
| Vinyl alcohol polymer having a thiol group at one end thereof (degree of polymerization of 450, degree of hydrolysis of 80 mol %, thiol group content of 0.2 mol %) | 70 parts |
| Glycerine monomethacrylate | 50 parts |
| N,N—dimethyl acrylamide | 40 parts |
| Phenylenebisacrylamide | 10 parts |
| Methylhydroquinone | 0.05 parts |
| Benzoin isopropyl ether | 3 parts |
| Water (pH = 3.0) | 180 parts |

Using the respective components described above, photosensitive sheets were obtained and examined in a manner similar to Example 1. The test results are shown in Table 1.

COMPARATIVE EXAMPLE 1.

A hardened sheet was obtained and examined in a manner similar to Example 2 except that PVA-205 (degree of polymerization of 550, degree of hydrolysis of 88 mol%,) was used as a vinyl alcohol polymer.

COMPARATIVE EXAMPLE 2

A hardened sheet was obtained and examined in a manner similar to Example 2 except that PVA-405 (degree of polymerization of 550, degree of hydrolysis of 80 mol%) was used as a vinyl alcohol polymer.

TABLE 1

| | Extraction Rate of Vinyl Alcohol Polymer of Hardened Sheet 1 (%)* | Photosensitivity ($\mu$)** |
|---|---|---|
| Example 1 | 4.5 | 70 |
| Example 2 | 8.0 | 80 |
| Example 3 | 11.0 | 85 |
| Example 4 | 5.0 | 75 |
| Example 5 | 5.2 | 70 |
| Example 6 | 4.8 | 70 |
| Comparative Example 1 | 60 | 110 |
| Comparative Example 2 | 80 | 105 |

*The extraction rate was determined by regarding reduction in weight of the hardened sheet as reduction in weight of the vinyl alcohol polymer.
**Minimum line width of reproduced photo relief.

As is evident from Table 1, the compositions containing the vinyl alcohol polymers having at least one thiol group in the molecule thereof cause almost no removal of the vinyl alcohol polymers from the hardened sheets.

While the invention has been described in detail and reference to specific embodiments thereof, it will be apparent to one skilled in the art that various changes and modifications can be made therein without departing from the spirit and scope thereof.

We claim:

1. A photosensitive composition comprising;
   (a) a vinyl alcohol polymer having at least one thiol group in the molecule thereof,
   (b) an ethylenically unsaturated compound which is radically polymerizable, and,
   (c) a photoinitiator.

2. A photosensitive composition as claimed in claim 1 wherein (a) vinyl alcohol polymer having at least one thiol group in the molecule thereof is a vinyl alcohol polymer containing a thiol group of 0.01 to 5 mol%.

3. A photosensitive composition as claimed in claim 1 wherein (a) vinyl alcohol polymer having at least one thiol group in the molecule thereof is a vinyl alcohol polymer having a degree of polymerization of 20 to 5000 and a degree of hydrolysis of 30 to 100 mol% bases on the vinyl ester unit.

4. A photosensitive composition as claimed in claim 1 wherein (a) vinyl alcohol polymer having at least one thiol group in the molecule thereof is a vinyl alcohol polymer having at least one thiol group only at the ends of the molecule thereof.

5. A photosensitive composition as claimed in claim 1 wherein (a) vinyl alcohol polymer having at least one thiol group in the molecule thereof is a vinyl alcohol polymer having a thiol group only at one end of the molecule thereof, represented by general formula;

P-SH wherein P contains the following units A and B, wherein the content of A is 100 to 30 mol% and wherein its degree of polymerization is 20 to 5000.

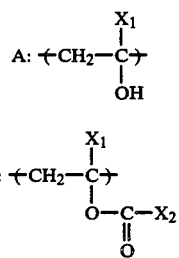

wherein $X_1$ represents H or a hydrocarbon group having 1 to 6 carbon atoms and $X_2$ represents H or a hydrocarbon group having 1 to 20 carbon atoms.

6. A photosensitive composition as claimed in claim 1 wherein (b) said ethylenically unsaturated compound which is radically polymerizable is at least one selected from the groups of the following general formulae [I], [II], [III] and [IV];

wherein
$R^1$ represents H or $CH_3$,
$L_1$ represents;

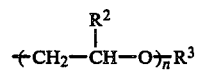

(wherein n=1~100), $+CH_2-CH_2CH_2CH_2-O+_mR^3$ (wherein m=1~100) $-C_pH_{2p+1}$ (wherein p=1~6),

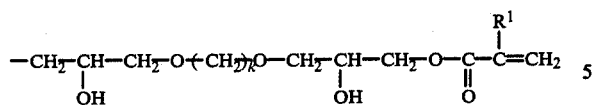

(wherein k=2~10) or,

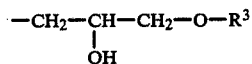

wherein
R² represents H or CH₃, and R³ represents H, CH₃, C₂H₅, C₄H₉,

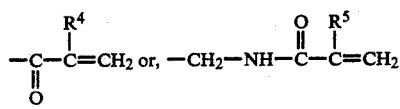

wherein R⁴ or R⁵ represents H or CH₃.

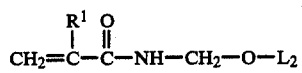 [II]

wherein
R¹ represents H or CH₃,
L₂ represents;

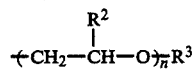

(wherein n=1~100), $-(CH_2-CH_2CH_2CH_2-O)_m-R^3$ (wherein m=1~100) $-C_pH_{2p+1}$ (wherein p=1~6), or H,
wherein
R² represents H or CH₃, and R³ represents H, CH₃, C₂H₅, C₄H₉ or,

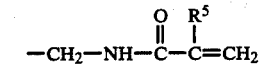

wherein R⁵ represents H or CH₃,

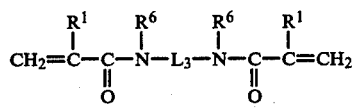 [III]

wherein
R¹ represents H or CH₃,
R⁶ represents H, CH₃ or C₂H₅,
L₃ represents $-(CH_2)_q-$ (wherein q=1~6),

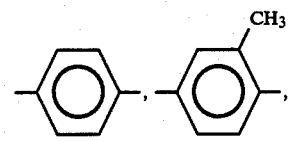

or, $-CH_2-CH_2-NH-_rCH_2CH_2-$ (wherein r=1~10).

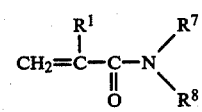 [IV]

wherein
R¹ represents H or CH₃,
R⁷ represents H, CH₃, C₂H₅ or CH₂CH₂OH,
R⁸ represents H, CH₃, C₂H₅ or CH₂CH₂OH.

7. A photosensitive composition as claimed in claim 1 comprising;
(a) 100 parts by weight of the vinyl alcohol polymer having at least one thiol group in the molecule thereof,
(b) 30 to 250 parts by weight of the ethylenically unsaturated compound which is radically polymerizable, and,
(c) 0.01 to 15 parts by weight of the photoinitiator.

8. A photosensitive composition as claimed in claim 1 wherein the photosensitive composition is used as plate-making material for letterpress plate.

* * * * *